US010431532B2

(12) United States Patent
Ise

(10) Patent No.: US 10,431,532 B2
(45) Date of Patent: Oct. 1, 2019

(54) SEMICONDUCTOR DEVICE WITH NOTCHED MAIN LEAD

(71) Applicant: ROHM CO., LTD., Kyoto-shi, Kyoto (JP)

(72) Inventor: Kota Ise, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 65 days.

(21) Appl. No.: 14/708,962

(22) Filed: May 11, 2015

(65) Prior Publication Data

US 2015/0325504 A1   Nov. 12, 2015

(30) Foreign Application Priority Data

May 12, 2014   (JP) .................. 2014-098522
May 11, 2015   (JP) .................. 2015-096271

(51) Int. Cl.
*H01L 23/495*   (2006.01)
*H01L 23/31*    (2006.01)
*H01L 23/00*    (2006.01)

(52) U.S. Cl.
CPC .... *H01L 23/49582* (2013.01); *H01L 23/3107* (2013.01); *H01L 23/49503* (2013.01); *H01L 23/49513* (2013.01); *H01L 23/49524* (2013.01); *H01L 23/49541* (2013.01); *H01L 23/49548* (2013.01); *H01L 23/49562* (2013.01); *H01L 24/06* (2013.01); *H01L 24/48* (2013.01); *H01L 24/49* (2013.01); *H01L 24/45* (2013.01); *H01L 2224/0603* (2013.01); *H01L 2224/32245* (2013.01); *H01L 2224/45015* (2013.01); *H01L 2224/45144* (2013.01); *H01L 2224/48091* (2013.01); *H01L 2224/48106* (2013.01); *H01L 2224/48247* (2013.01); *H01L 2224/48471* (2013.01); *H01L 2224/48479* (2013.01); *H01L 2224/49171* (2013.01); *H01L 2224/73265* (2013.01); *H01L 2924/00014* (2013.01); *H01L 2924/01014* (2013.01); *H01L 2924/01079* (2013.01); *H01L 2924/01322* (2013.01);

(Continued)

(58) Field of Classification Search
CPC ....... H01L 2924/1715; H01L 23/49548; H01L 23/49503; H01L 23/49582; H01L 2224/48247; H01L 23/3142; H01L 23/49838

See application file for complete search history.

(56) References Cited

U.S. PATENT DOCUMENTS

2002/0005573 A1 *  1/2002  Maeda ................ H01L 23/3107
                                                             257/678
2003/0160339 A1 *  8/2003  Ikegami .............. H01L 21/561
                                                             257/787

(Continued)

FOREIGN PATENT DOCUMENTS

JP        2012-190936 A       10/2012

*Primary Examiner* — Lex H Malsawma
*Assistant Examiner* — Laura M Dykes
(74) *Attorney, Agent, or Firm* — Hamre, Schumann, Mueller & Larson, P.C.

(57) ABSTRACT

A semiconductor device is provided with a semiconductor element, a main lead on which the semiconductor element is disposed, and a resin package that covers the semiconductor element and the main lead. A notch that is recessed toward the center of the main lead in plan view as seen in the thickness direction of the semiconductor element is formed in the main lead.

34 Claims, 9 Drawing Sheets

(52) U.S. Cl.
CPC ............... *H01L 2924/13091* (2013.01); *H01L 2924/173* (2013.01); *H01L 2924/1715* (2013.01); *H01L 2924/181* (2013.01); *H01L 2924/20642* (2013.01); *H01L 2924/20643* (2013.01)

(56) References Cited

U.S. PATENT DOCUMENTS

| | | | | |
|---|---|---|---|---|
| 2005/0173793 | A1* | 8/2005 | Rohrmoser | H01L 21/561 257/724 |
| 2006/0145318 | A1* | 7/2006 | Zhang | H01L 23/49562 257/676 |
| 2007/0108564 | A1* | 5/2007 | Tang | H01L 23/3107 257/675 |
| 2010/0052126 | A1* | 3/2010 | Hui | H01L 33/62 257/676 |
| 2010/0163920 | A1* | 7/2010 | Itai | H01L 33/486 257/99 |
| 2010/0270571 | A1* | 10/2010 | Seo | H01L 33/486 257/98 |
| 2013/0221509 | A1* | 8/2013 | Oda | H01L 24/97 257/676 |
| 2013/0277706 | A1* | 10/2013 | Chen | H01L 33/64 257/99 |
| 2013/0334677 | A1* | 12/2013 | Otremba | H05K 1/0296 257/706 |
| 2014/0175501 | A1* | 6/2014 | Sota | H01L 33/62 257/99 |

\* cited by examiner

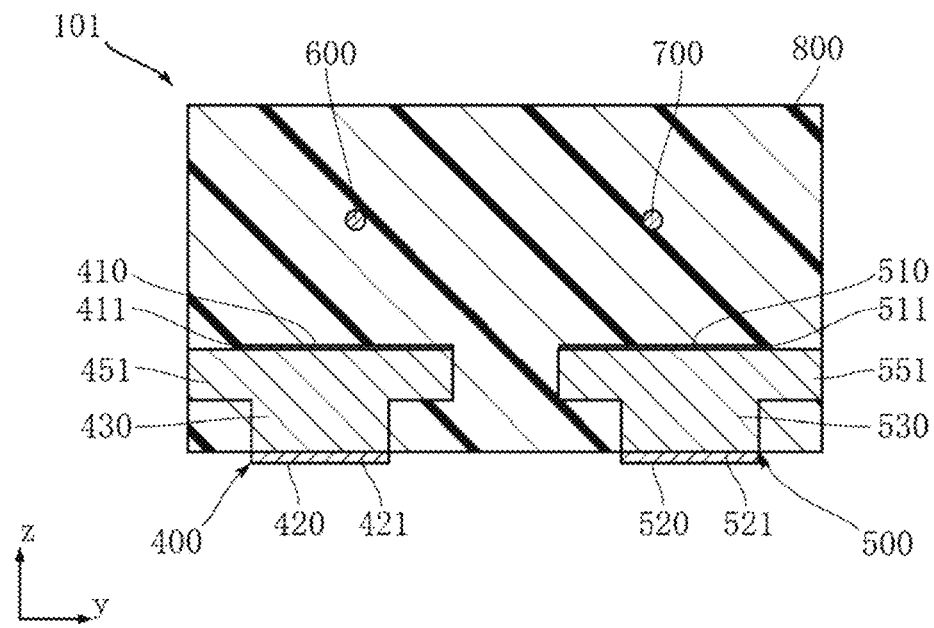
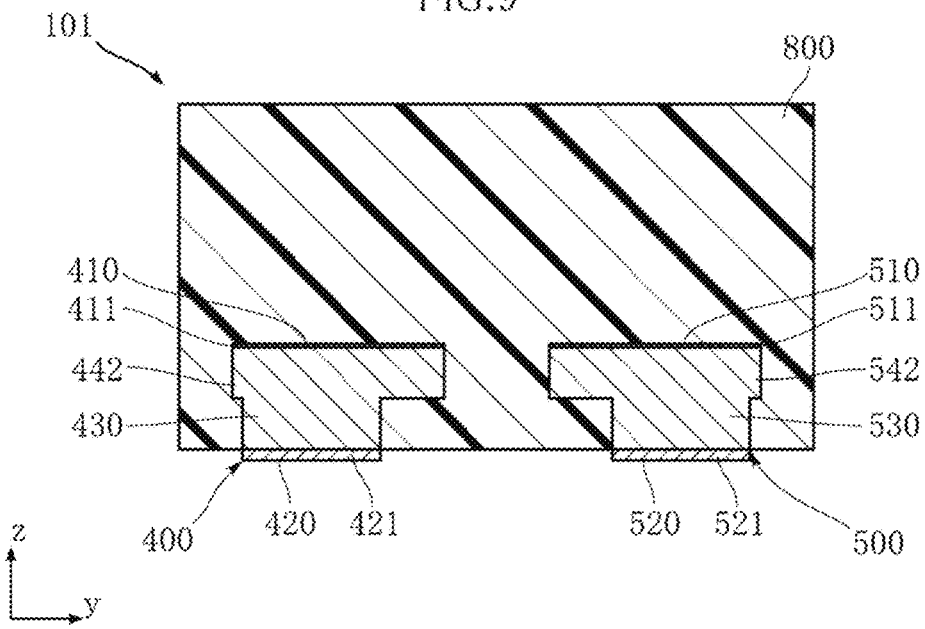

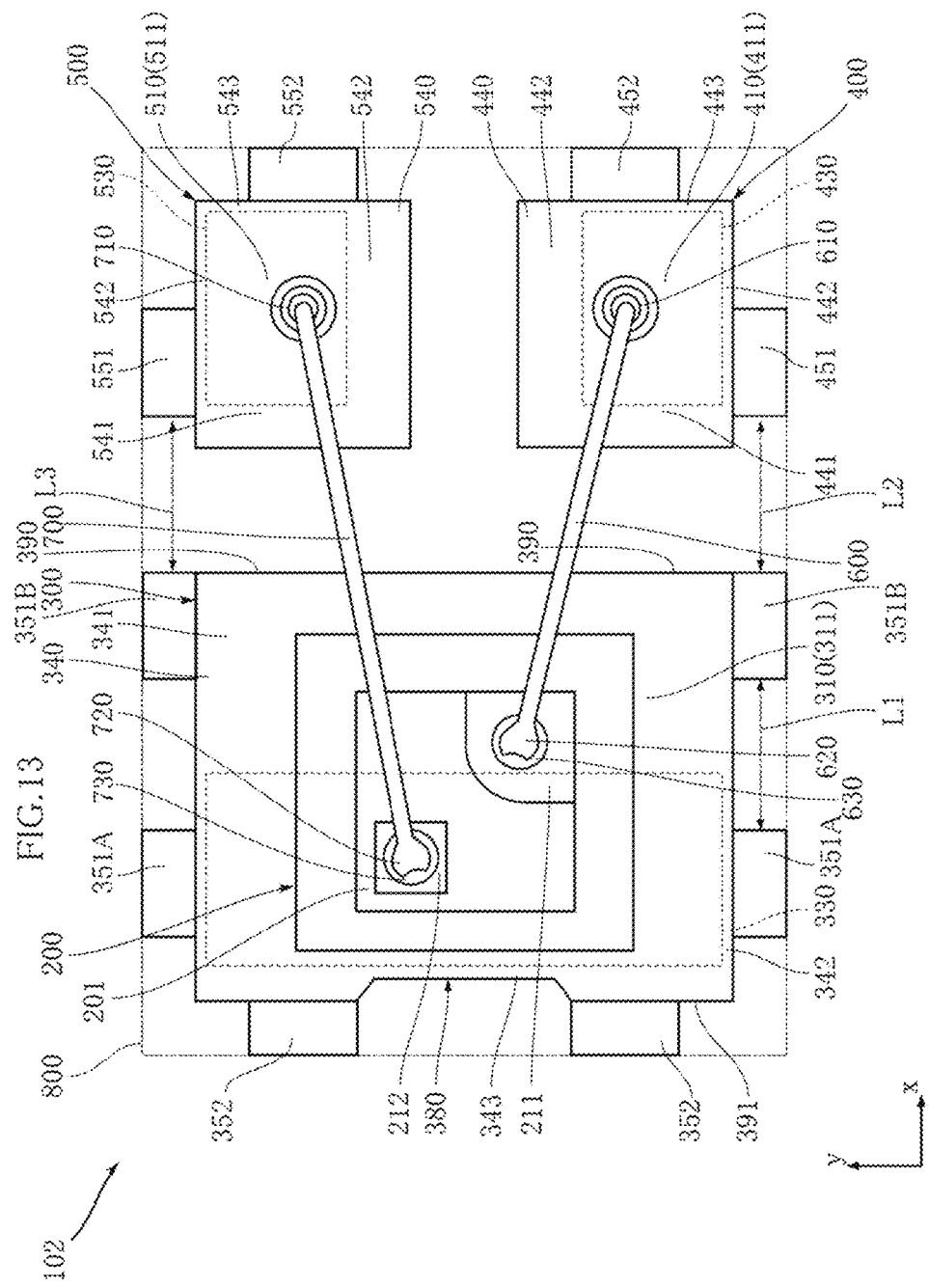

SEMICONDUCTOR DEVICE WITH NOTCHED MAIN LEAD

BACKGROUND OF THE INVENTION

1. Field of the Invention:

The present invention relates to a semiconductor device.

2. Description of Related Art:

Heretofore, semiconductor devices in which semiconductor elements such as transistors are sealed by a resin package, for example, have been proposed. Among such semiconductor devices, a semiconductor device provided with a semiconductor element having three electrodes, three leads electrically connected to these electrodes, and a resin package covering the semiconductor element and a portion of each of the three leads, for example, has been disclosed. The three electrodes are formed on the same surface of the semiconductor element. The semiconductor element is joined to one of the three leads. The three electrodes are respectively electrically connected to a different one of the three leads via three wires. The resin package covers the entirety of the semiconductor device, all of the three wires, and a portion of each of the three leads. Portions of the three leads that project from the resin package serve as terminal areas for mounting the semiconductor device. Known documents relating to semiconductor devices include JP-A-2012-190936, for example.

In a conventional semiconductor device, the semiconductor element may be smaller in plan view than the lead on which the semiconductor element is disposed. Thus, depending on the technician, the semiconductor element could possibly be displaced from the desired disposition location on the lead.

SUMMARY OF THE INVENTION

The present invention has been proposed under the above circumstances, and a main object of the invention is to provide a semiconductor device that enables a semiconductor element to be disposed at a desired location on the lead, irrespective of the technician, even in the case where the semiconductor element is comparatively small.

According to an aspect of the present invention, a semiconductor device is provided that includes a semiconductor element, a main lead on which the semiconductor element is disposed, and a resin package covering the semiconductor element and the main lead, with a notch recessed toward a center of the main lead in plan view as seen in a thickness direction of the semiconductor element being formed in the main lead.

Preferably, the semiconductor device further includes a first auxiliary lead electrically connected to the semiconductor element, and the first auxiliary lead is separated from the main lead and exposed from the resin package.

Preferably, the notch has a shape recessed in a direction from the first auxiliary lead toward the main lead in plan view.

Preferably, the main lead has an end face located furthest on the first auxiliary lead side of the main lead, and the notch has a shape recessed from the end face in plan view.

Preferably, the notch has a shape recessed from a region on an opposite side of the main lead to the first auxiliary lead in plan view.

Preferably, the main lead has an end face located on the opposite side of the main lead to the first auxiliary lead, and the notch has a shape recessed from the end face in plan view.

Preferably, the main lead has a main lead main surface and a main lead back surface that face in opposite directions to each other, and the semiconductor element is disposed on the main lead main surface.

Preferably, the main lead includes a main full thickness part and a main eave part, the main full thickness part extends from the main lead main surface to the main lead back surface, and the main eave part projects from the main full thickness part in a direction at right angles to the thickness direction of the semiconductor element.

Preferably, the semiconductor element overlaps with each of the main full thickness part and the main eave part in plan view.

Preferably, the notch is formed in the main eave part.

Preferably, the semiconductor element overlaps with the main lead in plan view, throughout an entirety of the semiconductor element.

Preferably, the main eave part has a main front part, the main front part projects from the main full thickness part toward the first auxiliary lead, and the notch is formed in the main front part.

Preferably, the main eave part has a main lateral part, and the main lateral part projects from the main full thickness part in a direction at right angles to the direction in which the main front part projects.

Preferably, the main lead includes a first main lateral connecting part projecting from the main eave part, the direction in which the first main lateral connecting part projects is a direction orthogonal to a direction from the main lead toward the first auxiliary lead, and the first main lateral connecting part has an end face exposed from the resin package.

Preferably, the main lead includes a second main lateral connecting part projecting from the main eave part, the direction in which the second main lateral connecting part projects is a direction orthogonal to a direction from the main lead toward the first auxiliary lead, the second main lateral connecting part has an end face exposed from the resin package, and the first main lateral connecting part and the second main lateral connecting part are juxtaposed with each other.

Preferably, the second main lateral connecting part is located between the first main lateral connecting part and the first auxiliary lead in a direction from the main lead toward the first auxiliary lead.

Preferably, a distance separating the first main lateral connecting part from the second main lateral connecting part is 0.2 to 0.3 mm.

Preferably, the main eave part has a main rear part, and the main rear part projects from the main full thickness part in an opposite direction to the direction in which the main front part projects.

Preferably, the main lead includes a main rear connecting part projecting from the main rear part, and the main rear connecting part has an end face exposed from the resin package.

Preferably, the main full thickness part is surrounded by the main eave part in plan view, throughout an entirety thereof.

Preferably, the semiconductor device further includes a main front surface plating layer formed on the main lead, and interposed between the semiconductor element and the main lead.

Preferably, the main front surface plating layer has a substantially rectangular shape in plan view.

Preferably, the notch has a shape in which the main front surface plating layer is recessed in plan view.

Preferably, the main front surface plating layer overlaps with an entirety of the main eave part.

Preferably, the first auxiliary lead includes a first auxiliary full thickness part and a first auxiliary eave part, the first auxiliary lead has a first auxiliary lead main surface and a first auxiliary lead back surface that face in opposite directions to each other, the first auxiliary full thickness part extends from the first auxiliary lead main surface to the first auxiliary lead back surface, and the first auxiliary eave part projects from the first auxiliary full thickness part in a direction at right angles to the thickness direction of the semiconductor element, and constitutes the first auxiliary lead main surface.

Preferably, the first auxiliary eave part has a first auxiliary front part, and the first auxiliary front part projects from the first auxiliary full thickness part toward the main lead.

Preferably, the first auxiliary lead includes a first auxiliary lateral connecting part projecting from the first auxiliary eave part, the direction in which the first auxiliary lateral connecting part projects is a direction orthogonal to a direction from the main lead toward the first auxiliary lead, and the first auxiliary lateral connecting part has an end face exposed from the resin package.

Preferably, a distance separating the first auxiliary lateral connecting part from the main lead is 0.2 to 0.3 mm.

Preferably, the semiconductor device further includes a first wire joined to the semiconductor element, and electrically connecting the semiconductor element and the first auxiliary lead.

Preferably, the semiconductor device further includes a first auxiliary surface plating layer interposed between the first auxiliary lead and the first wire.

Preferably, the semiconductor device further includes a second auxiliary lead that is electrically connected to the semiconductor element, and the second auxiliary lead is separated from the main lead and exposed from the resin package.

Preferably, the semiconductor device further includes a second wire joined to the semiconductor element, and electrically connecting the semiconductor element and the second auxiliary lead.

Preferably, the semiconductor device further includes a second auxiliary surface plating layer interposed between the second auxiliary lead and the second wire.

Preferably, the semiconductor element has a semiconductor layer, a eutectic layer of a semiconductor and a metal, and a monolithic metal layer constituting a back surface electrode that are laminated one on the other, and the monolithic metal layer is joined directly to the main lead.

Preferably, the eutectic layer is made of a eutectic of Si and Au.

Preferably, the monolithic metal layer is thinner than the eutectic layer.

Further features and advantages of the present invention will become apparent from the following detailed description with reference to the attached drawings.

BRIEF DESCRIPTION OF THE DRAWINGS

FIG. 8 is a cross-sectional view along a line VIII-VIII in FIG. 3.

FIG. 9 is a cross-sectional view along a line IX-IX in FIG. 3.

FIG. 13 is a plan view showing the semiconductor device of FIG. 12.

DESCRIPTION OF THE PREFERRED EMBODIMENTS

Hereinafter, embodiments of the present invention will be specifically described with reference to the drawings.

<First Embodiment>

A first embodiment of the present invention will be described using FIGS. 1 to 11.

Figure 1:
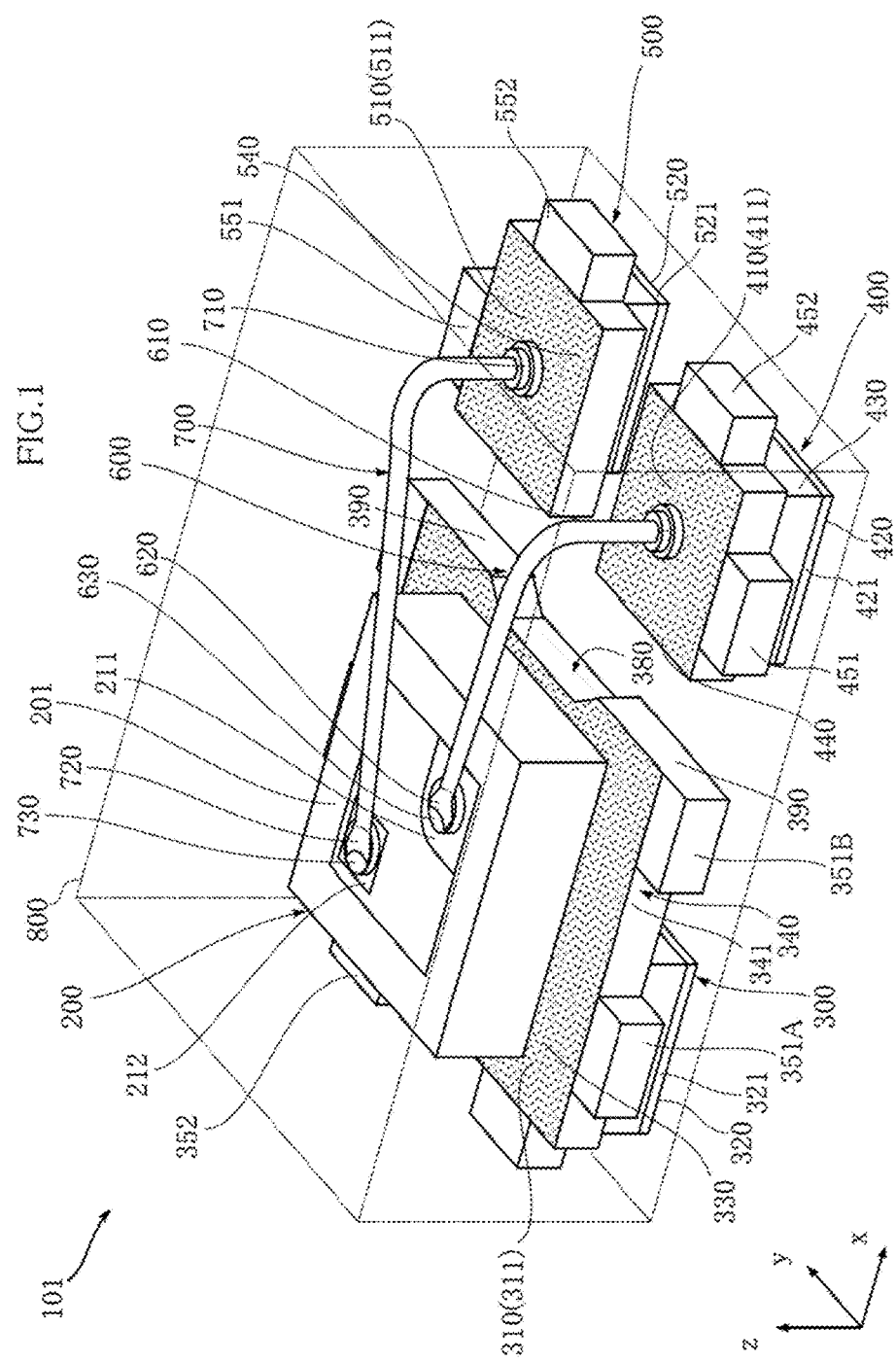
FIG. 1 is a perspective view showing an example of a semiconductor device that is based on a first embodiment of the present invention.
Figure 2:
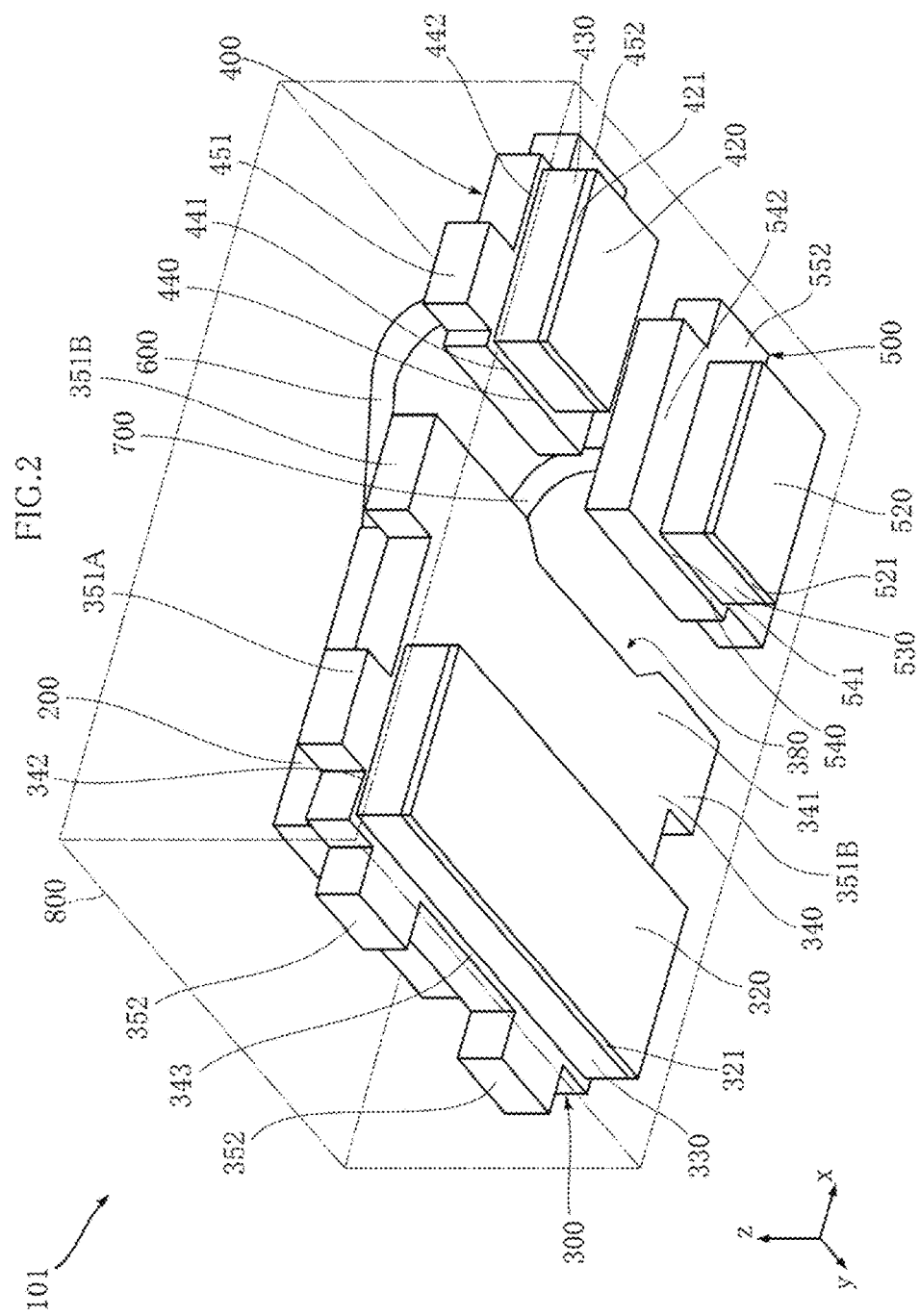
FIG. 2 is a perspective view showing the semiconductor device of FIG. 1.
Figure 3:
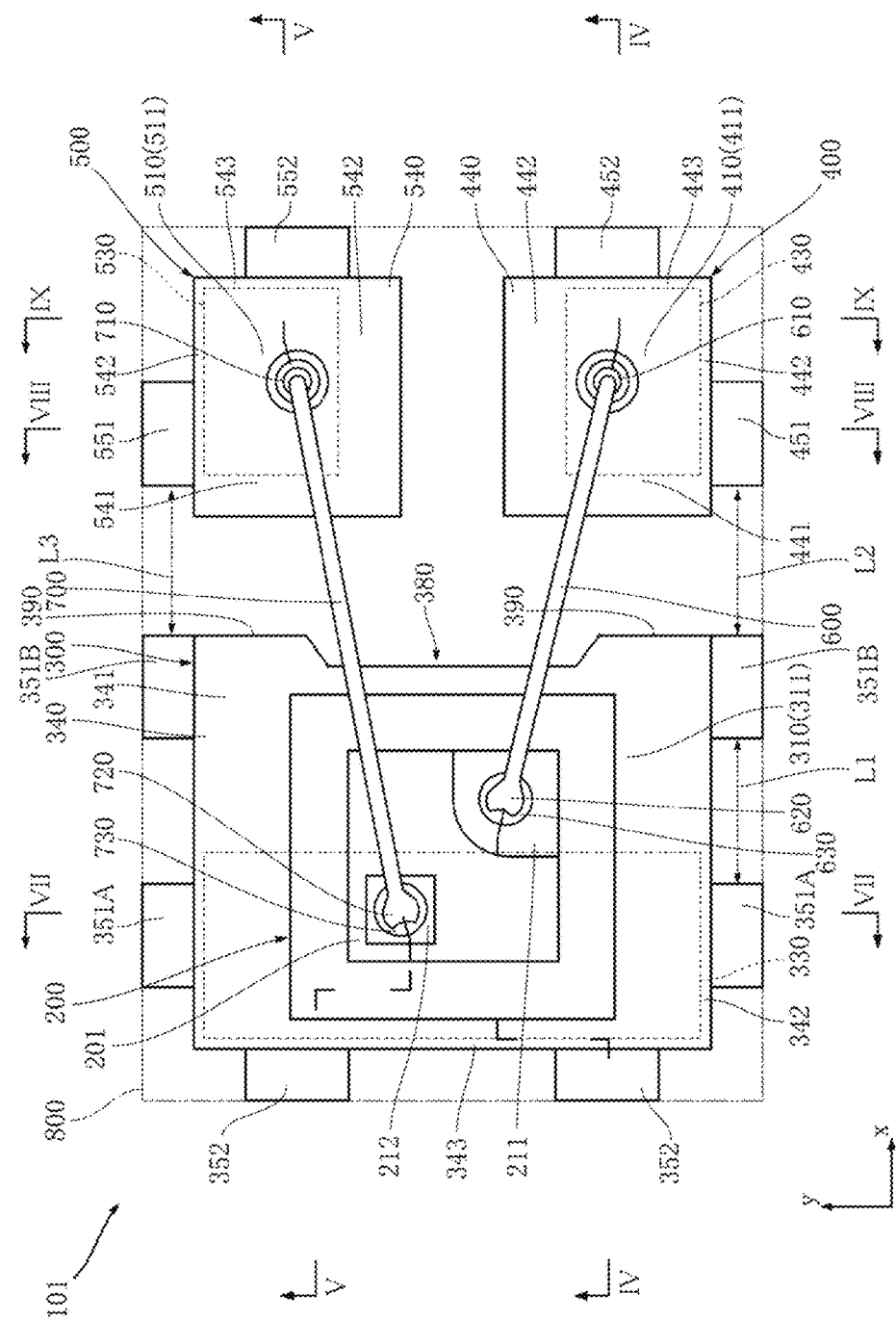
FIG. 3 is a plan view showing the semiconductor device of FIG. 1.
Figure 4:
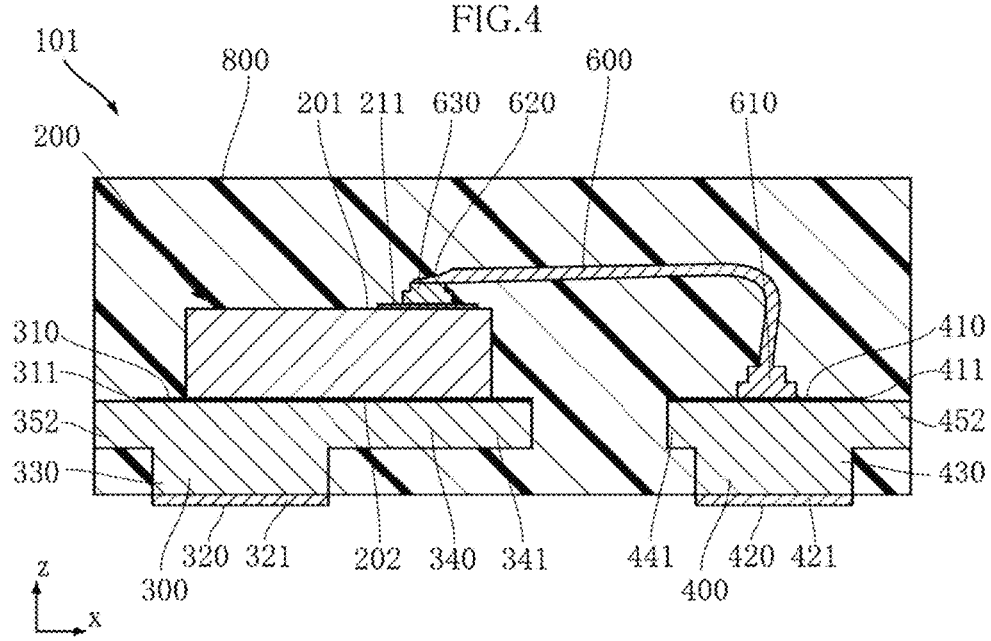
FIG. 4 is a cross-sectional view along a line IV-IV in FIG. 3.
Figure 5:
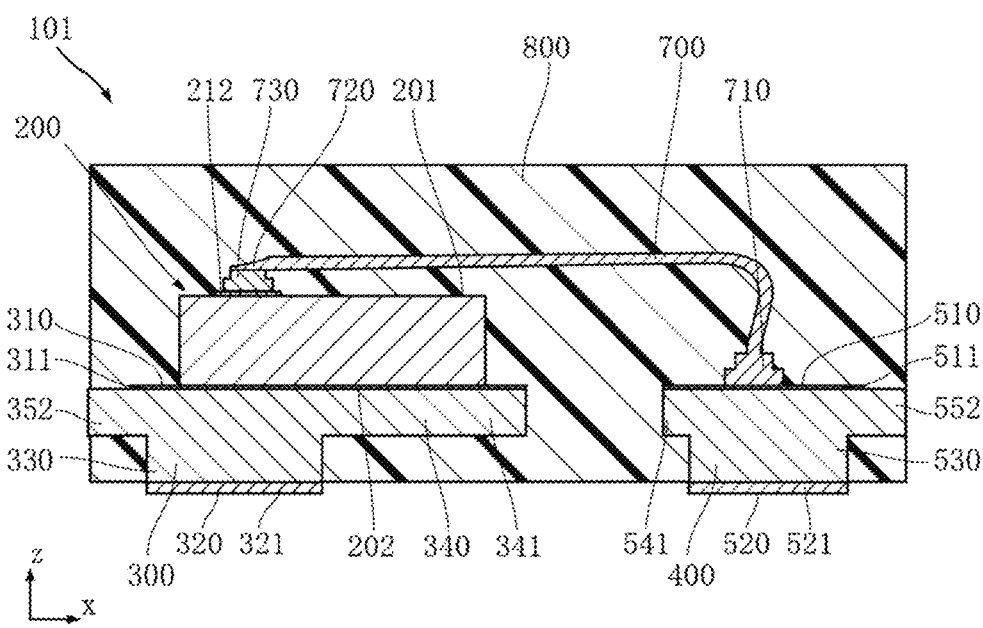
FIG. 5 is a cross-sectional view along a line V-V in FIG. 3.
Figure 6:
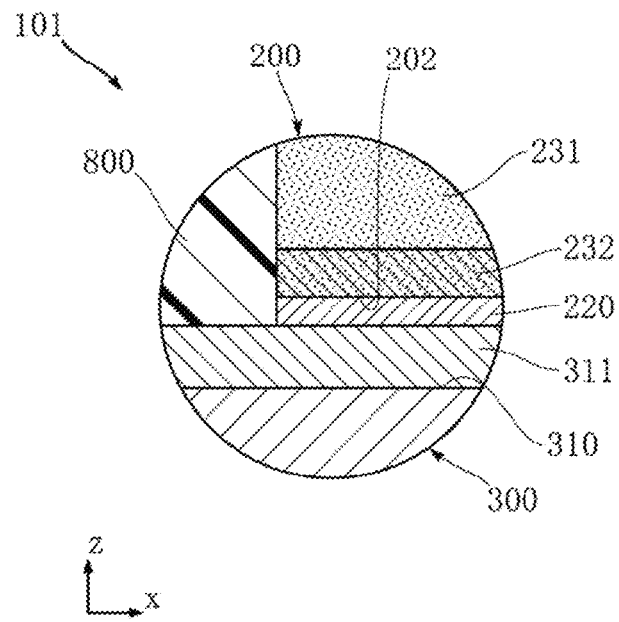
FIG. 6 is an enlarged cross-sectional view showing a main section of the semiconductor device of FIG. 1.
Figure 7:
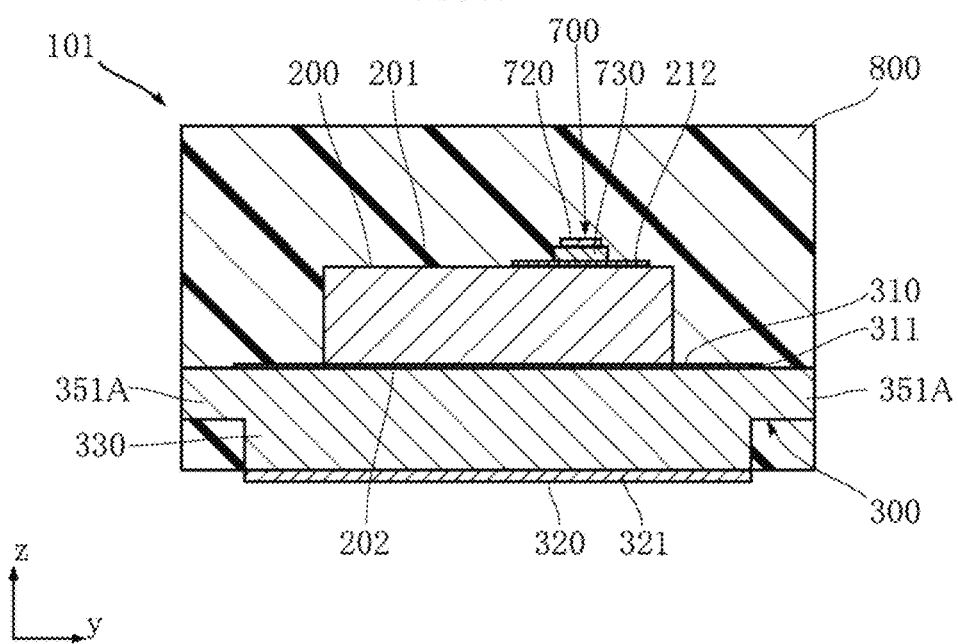
FIG. 7 is a cross-sectional view along a line VII-VII in FIG. 3.
Figure 10:
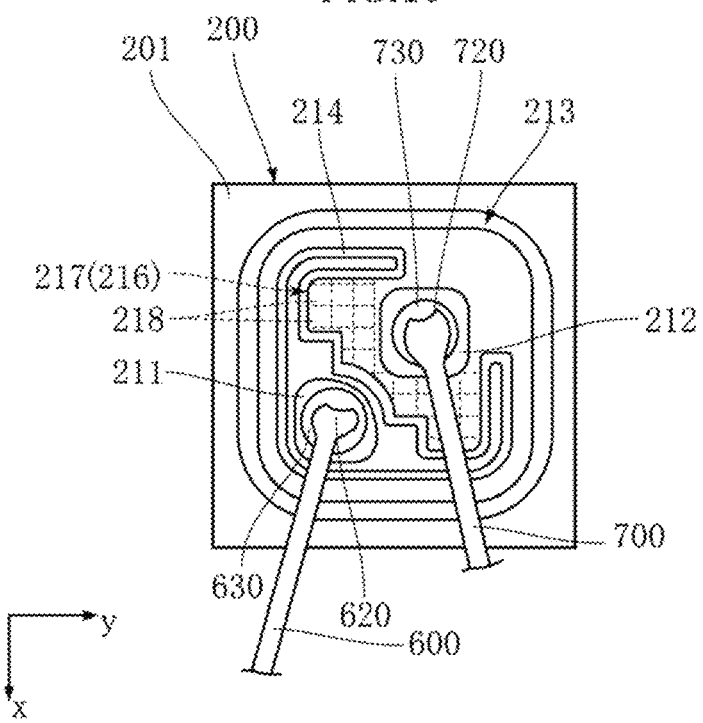
FIG. 10 is an enlarged plan view showing a main section of a semiconductor element of the semiconductor device of FIG. 1.

FIG. 1 is a perspective view showing an example of a semiconductor device that is based on the first embodiment of the present invention. FIG. 2 is a perspective view showing the semiconductor device of FIG. 1. FIG. 3 is a plan view showing the semiconductor device of FIG. 1. FIG. 4 is a cross-sectional view along a line IV-IV in FIG. 3. FIG. 5 is a cross-sectional view along a line V-V in FIG. 3. FIG. 6 is an enlarged cross-sectional view showing a main section of the semiconductor device of FIG. 1. FIG. 7 is a cross-sectional view along a line VII-VII in FIG. 3. FIG. 8 is a cross-sectional view along a line VIII-VIII in FIG. 3. FIG. 9 is a cross-sectional view along a line IX-IX in FIG. 3. FIG. 10 is an enlarged plan view showing a main section of the semiconductor element of the semiconductor device of FIG. 1.

A semiconductor device 101 shown in these diagrams is constituted as a so-called surface mount type semiconductor device that is comparatively compact. To give an example of the size of the semiconductor device 101, the semiconductor device 101 has dimensions of about 1.0 mm in an x direction, about 0.6 mm in a y direction, and about 0.36 mm in a z direction. Note that the z direction is the thickness direction of the semiconductor element, a main lead, a first auxiliary lead, and a second auxiliary lead.

The semiconductor device 101 is provided with a semiconductor element 200, a main lead 300, and a first auxiliary lead 400, a second auxiliary lead 500, a first wire 600, a second wire 700, and a resin package 800. Note that the z direction is the thickness direction of the semiconductor element 200, and the view in the z direction is equivalent to a so-called plan view.

The semiconductor element 200 is, in the present embodiment, constituted as a so-called transistor. The semiconductor element 200 has a front surface 201 and a back surface 202, and a first front surface electrode 211, a second front surface electrode 212 and a back surface electrode 220 are formed thereon. The front surface 201 and the back surface 202 face in opposite directions to each other in the z direction. To given an example of the size of the semiconductor element 200, the semiconductor element 200 has dimensions of about 300 µm in the x direction and about 300 µm in the y direction.

As shown in FIGS. 3 and 10, the first front surface electrode 211 and the second front surface electrode 212 are formed on the front surface 201, and are each constituted by a portion of an electrode layer 213 consisting of an Au plating layer, for example. In the present embodiment, the first front surface electrode 211 is a gate electrode and the second front surface electrode 212 is a source electrode. In the present embodiment, the first front surface electrode 211 is located on the right side in the x direction in FIG. 3, and the second front surface electrode 212 is located on the left side in the x direction. Also, the first front surface electrode 211 is located on the lower side in the y direction in the diagram, and the second front surface electrode 212 is located on the upper side in the y direction. The back surface electrode 220 (see FIG. 6) is formed on the back surface 202. In the present embodiment, the back surface electrode 220 is a drain electrode.

A portion of the electrode layer 213 has been removed to form a removed region 214. The removed region 214 is formed into a shape that surrounds the first front surface electrode 211. More specifically, the removed region 214 has portions that extend in parallel to each other along the four sides of the semiconductor element 200, and a portion that is positioned sandwiching a comparatively large area in order to surround the first front surface electrode 211. The first front surface electrode 211 and the second front surface electrode 212 are insulated by the removed region 214 formed into such an annular shape.

The region surrounding the second front surface electrode 212 serves as an active region 216. In the active region 216, a MOSFET 217 is built into a region positioned inwardly from the front surface 201 in the z direction. The MOSFET 217 is constituted by a plurality of unit cells 218 disposed in a matrix. Note that the plurality of unit cells 218 are not limited to being arrayed in a matrix, and may be arrayed in a striped or staggered form, for example.

Note that although, in the present embodiment, one second front surface electrode 212 serving as a source electrode is provided, the present invention is not limited thereto and a plurality of second front surface electrodes 212 may be provided.

FIG. 6 shows a vicinity of the back surface electrode 220 of the semiconductor element 200. The semiconductor element 200 of the present embodiment has a semiconductor layer 231 and a eutectic layer 232. The semiconductor layer 231 is a layer in which each of the regions functioning as a transistor are incorporated, and is made of Si, for example. The eutectic layer 232 consists of a eutectic mixture of a metal and the semiconductor that constitutes the semiconductor layer 231. In the present embodiment, the eutectic layer 232 consists of eutectic mixture of Au as the metal and Si as the semiconductor. The eutectic layer 232 is formed by laminating a layer made of Au on the semiconductor layer 231, and then alloying these materials through the application of heat. The back surface electrode 220 is laminated on the lower side of the eutectic layer 232 in the z direction. The back surface electrode 220 consists of a layer of Au formed by vapor deposition on the eutectic layer 232, for example, and is an example of what is referred to in the present invention as a monolithic metal layer. The eutectic layer 232 has a thickness of about 1200 nm. The back surface electrode 220 serving as a monolithic metal layer has a thickness of about 600 nm, for example, and is thinner than the eutectic layer 232. In the present embodiment, the surface that faces downward from the eutectic layer 232 in the z direction is defined as the back surface 202 of the semiconductor element 200.

The main lead 300 has a main lead main surface 310, a main lead back surface 320, a main full thickness part 330, and a main eave part 340. The main lead 300 is formed by patterning such as etching being performed on a metal plate made of Cu, for example. As viewed in the thickness direction z, the semiconductor element 200 overlaps with the main lead 300 throughout the entirety of the semiconductor element 200.

The main lead main surface 310 faces upward in the z direction, and is the region on which the semiconductor element 200 is mounted. In the present embodiment, the main lead main surface 310 has a rectangular shape with dimensions of about 0.4 mm in the x direction and about 0.5 mm in the y direction. Also, in the present embodiment, a main front surface plating layer 311 is formed on the main lead main surface 310. The main front surface plating layer 311 is interposed between the semiconductor element 200 and the main lead 300. The main front surface plating layer 311 is formed over the entire area of the main lead main surface 310. The main front surface plating layer 311 is made of Ag of about 2 µm in thickness, for example. Note that, in FIG. 1, the main front surface plating layer 311 is shaded for convenience of understanding. In the present embodiment, the main front surface plating layer 311 is substantially rectangular as seen in the z direction (in plan view).

The main lead back surface 320 faces downward in the z direction in the opposite direction to the main lead main surface 310, and is used in order to surface mount the semiconductor device 101. The main lead back surface 320 has a rectangular shape with dimensions of about 0.18 mm in the x direction and about 0.48 mm in the y direction. The main lead back surface 320 overlaps with the main lead main surface 310 throughout its entirety and is contained within the main lead main surface 310, as seen in the z direction (in plan view). In the present embodiment, a main back surface plating layer 321 is formed on the main lead 300. The main back surface plating layer 321 is laminated on a region of the main lead 300 that is for forming the main lead back surface 320, and is made of Ni, Sn or an alloy thereof at about 0.06 mm in thickness, for example. In the present embodiment, the lower surface of the main back surface plating layer 321 in z direction is defined, for convenience, as the main lead back surface 320, although in a configuration that does not have the main back surface plating layer 321, for example, the main lead back surface 320 may be constituted by the abovementioned portion made of Cu.

The main full thickness part 330 is a region extending from the main lead main surface 310 to the main lead back surface 320 in the z direction. In the present embodiment, the main full thickness part 330 indicates a region made of Cu excluding the main back surface plating layer 321, and the thickness thereof is about 0.1 mm. The main full thickness part 330 is surrounded around its entirety by the main eave part 340, as seen in the thickness direction z.

The main eave part 340 projects from a portion on the main lead main surface 310 side of the main full thickness part 330 in the x and y directions, which are at right angles to the z direction. An upper end face of the main eave part 340 in the z direction is flush with the main full thickness part 330. In the present embodiment, the main eave part 340 has a main front part 341, a main lateral part 342, and a main rear part 343. The thickness of the main eave part 340 is half of the main full thickness part 330, for example.

The main front part 341 projects from the main full thickness part 330 toward the first auxiliary lead 400 and the second auxiliary lead 500 in the x direction.

The main lateral part 342 projects from the main full thickness part 330 in the y direction. In the present embodiment, two main lateral parts 342 are formed.

In the present embodiment, the main lead 300 has two first main lateral connecting parts 351A and two second main lateral connecting parts 351B. The first main lateral connecting parts 351A and the second main lateral connecting parts 351B extend from the main lateral parts 342 of the main eave part 340. The direction in which the first main lateral connecting parts 351A project and the direction in which the second main lateral connecting parts 351B project is a direction (y direction) that is orthogonal to the direction (x direction) from the main lead 300 toward the first auxiliary lead 400. The first main lateral connecting parts 351A and the second main lateral connecting parts 351B are juxtaposed with each other. The first main lateral connecting parts 351A and the second main lateral connecting parts 351B are formed to have the same thickness as the main lateral parts 342. The first main lateral connecting parts 351A and the second main lateral connecting parts 351B have end faces that are exposed from the resin package 800. The second main lateral connecting parts 351B are located between the first main lateral connecting parts 351A and the first auxiliary lead 400 in the direction from the main lead 300 toward the first auxiliary lead 400. A distance L1 (see FIG. 3) separating the first main lateral connecting parts 351A from the second main lateral connecting parts 351B is 0.2 to 0.3 mm, for example.

The main rear part 343 projects from the main full thickness part 330 in the opposite direction to the main front part 341. In the present embodiment, the main lead 300 has two main rear connecting parts 352. The main rear connecting parts 352 extend from the main rear part 343 of the main eave part 340, and are formed to have the same thickness as the main rear part 343. An end face of the main rear connecting parts 352 in the x direction is exposed from the resin package 800.

According to the abovementioned configuration, in the present embodiment, all of the main full thickness part 330 is surrounded by the main eave part 340 as seen in the z direction (in plan view). Also, upper surfaces of the main full thickness part 330 and the main eave part 340 in the z direction form the main lead main surface 310, and the main front surface plating layer 311 overlaps with all of the main full thickness part 330 and main eave part 340. The semiconductor element 200 overlaps with each of the main full thickness part 330 and the main eave part 340, as seen in the thickness direction z of the semiconductor element 200.

In the present embodiment, a notch 380 is formed in the main lead 300. The notch 380 has a shape that is recessed toward the center of the main lead 300 as seen in the thickness direction z of the semiconductor element 200. Specifically, the notch 380 has a shape that is recessed in a direction from the first auxiliary lead 400 toward the main lead 300, as seen in the thickness direction z of the semiconductor element 200. The notch 380 is formed in the main eave part 340 (more specifically, in the main front part 341). Also, the notch 380 has a shape formed by recessing the main front surface plating layer 311 as seen in the z direction (in plan view).

As shown in FIGS. 1, 3 and the like, the main lead 300 has an end face 390 that is located furthest on the first auxiliary lead 400 side of the main lead 300. The end face 390 is constituted by the second main lateral connecting parts 351B and the main front part 341. The abovementioned notch 380 has a shape that is recessed from the end face 390, as seen in the thickness direction z of the semiconductor element 200.

As shown in FIG. 6, the semiconductor element 200 is joined at the back surface electrode 220 to the main lead main surface 310 (main front surface plating layer 311). Specifically, the back surface electrode 220 serving as a monolithic metal layer is joined directly to the main lead main surface 310 (the main front surface plating layer 311) by a thermocompression bonding technique. In this thermocompression bonding, only heat and pressure are applied, and vibration is not applied.

The first auxiliary lead 400 is disposed so as to be separated from the main lead 300 in the x direction. The first auxiliary lead 400 is exposed from the resin package 800 to the outside of the resin package 800 as seen in the thickness direction z of the semiconductor element 200. The first auxiliary lead 400 has a first auxiliary lead main surface 410, a first auxiliary lead back surface 420, a first auxiliary full thickness part 430, and a first auxiliary eave part 440. The first auxiliary lead 400 is formed by performing patterning such as etching on a metal plate made of Cu, for example. The first auxiliary lead 400 is electrically connected to the semiconductor element 200.

The first auxiliary lead main surface 410 faces upward in the z direction, and is the region to which the first wire 600 is bonded. In the present embodiment, the first auxiliary lead main surface 410 has a rectangular shape. Also, in the present embodiment, a first auxiliary front surface plating layer 411 is formed on the first auxiliary lead main surface 410. The first auxiliary front surface plating layer 411 is interposed between the first auxiliary lead 400 and the first wire 600. The first auxiliary front surface plating layer 411 is formed over the entire area of the first auxiliary lead main surface 410. The first auxiliary front surface plating layer 411 is made of Ag of about 2 μm in thickness, for example. Note that, in FIG. 1, the first auxiliary front surface plating layer 411 is shaded for convenience of understanding.

The first auxiliary lead back surface 420 faces downward in the z direction in the opposite direction to the first auxiliary lead main surface 410, and is used in order to surface mount the semiconductor device 101. The first auxiliary lead back surface 420 has a rectangular shape. The first auxiliary lead back surface 420 overlaps with the first auxiliary lead main surface 410 throughout its entirety and is contained within the first auxiliary lead main surface 410, as seen in the z direction (in plan view). In the present embodiment, a first auxiliary back surface plating layer 421 is formed on the first auxiliary lead 400. The first auxiliary back surface plating layer 421 is laminated on a region of the first auxiliary lead 400 that is for forming the first auxiliary lead back surface 420. In the present embodiment, the lower surface of the first auxiliary back surface plating layer 421 in the z direction is defined, for convenience, as the first auxiliary lead back surface 420, although in a configuration that does not have first auxiliary back surface plating layer 421, for example, the first auxiliary lead back surface 420 may be constituted by the abovementioned portion made of Cu.

The first auxiliary full thickness part 430 is a region that extends from the first auxiliary lead main surface 410 to the first auxiliary lead back surface 420 in the z direction. In the present embodiment, the first auxiliary full thickness part 430 indicates a region made of Cu excluding the first auxiliary back surface plating layer 421.

The first auxiliary eave part 440 projects from a portion on the first auxiliary lead main surface 410 side of the first auxiliary full thickness part 430 in the x and y directions, which are at right angles to the z direction. An upper end face of the first auxiliary eave part 440 in the z direction is flush with the first auxiliary full thickness part 430. The first auxiliary eave part 440 constitutes the first auxiliary lead main surface 410. In the present embodiment, the first auxiliary eave part 440 has a first auxiliary front part 441, a first auxiliary lateral part 442, and a first auxiliary rear part 443.

The first auxiliary front part 441 projects from the first auxiliary full thickness part 430 toward the main lead 300 in the x direction.

The first auxiliary lateral part 442 projects from the first auxiliary full thickness part 430 in the y direction. In the present embodiment, two first auxiliary lateral parts 442 are formed. The first auxiliary lateral part 442 that is located on the upper side in the y direction in FIG. 3 projects toward the second auxiliary lead 500. Also, in the present embodiment, the first auxiliary lead 400 has a first auxiliary lateral connecting part 451. The first auxiliary lateral connecting part 451 projects from the first auxiliary eave part 440. The first auxiliary lateral connecting part 451 is formed to have the same thickness as the first auxiliary lateral parts 442. The direction in which the first auxiliary lateral connecting part 451 projects is a direction that is orthogonal to a direction from the main lead 300 toward the first auxiliary lead 400. The first auxiliary lateral connecting part 451 has an end face that is exposed from the resin package 800. A distance L2 (see FIG. 3) separating the first auxiliary lateral connecting part 451 from the main lead 300 is 0.2 to 0.3 mm, for example.

The first auxiliary rear part 443 projects from the first auxiliary full thickness part 430 in the opposite direction to the first auxiliary front part 441. In the present embodiment, the first auxiliary lead 400 has a first auxiliary rear connecting part 452. The first auxiliary rear connecting part 452 extends from the first auxiliary rear part 443 of the first auxiliary eave part 440, and is formed to have the same thickness as the first auxiliary rear part 443. An end face of the first auxiliary rear connecting part 452 in the x direction is exposed from the resin package 800.

According to the abovementioned configuration, in the present embodiment, all of the first auxiliary full thickness part 430 is surrounded by the first auxiliary eave part 440 as seen in the z direction (in plan view). Also, upper surfaces of the first auxiliary full thickness part 430 and the first auxiliary eave part 440 in the z direction form the first auxiliary lead main surface 410, and the first auxiliary front surface plating layer 411 overlaps with all of the first auxiliary full thickness part 430 and the first auxiliary eave part 440.

The second auxiliary lead 500 is disposed so as to be separated from the main lead 300 in the x direction at a position juxtaposed with the first auxiliary lead 400 in the y direction. The second auxiliary lead 500 is exposed from the resin package 800 to the outside of the resin package 800 as seen in the thickness direction z of the semiconductor element 200. The second auxiliary lead 500 has a second auxiliary lead main surface 510, a second auxiliary lead back surface 520, a second auxiliary full thickness part 530, and a second auxiliary eave part 540. The second auxiliary lead 500 is formed by performing patterning such as etching on a metal plate made of Cu, for example. The second auxiliary lead 500 is electrically connected to the semiconductor element 200.

The second auxiliary lead main surface 510 faces upward in the z direction, and is the region to which the second wire 700 is bonded. In the present embodiment, the second auxiliary lead main surface 510 has a rectangular shape. Also, in the present embodiment, a second auxiliary surface plating layer 511 is formed on the second auxiliary lead main surface 510. The second auxiliary surface plating layer 511 is interposed between the second auxiliary lead 500 and the second wire 700. The second auxiliary surface plating layer 511 is formed over the entire area of the second auxiliary lead main surface 510. The second auxiliary surface plating layer 511 is made of Ag of about 2 μm in thickness, for example. Note that, in FIG. 1, the second auxiliary surface plating layer 511 is shaded for convenience of understanding.

The second auxiliary lead back surface 520 faces downward in the z direction in the opposite direction to the second auxiliary lead main surface 510, and is used in order to surface mount the semiconductor device 101. The second auxiliary lead back surface 520 has a rectangular shape. The second auxiliary lead back surface 520 overlaps with the second auxiliary lead main surface 510 throughout its entirety and is contained within the second auxiliary lead main surface 510, as seen in the z direction (in plan view). In the present embodiment, the second auxiliary back surface plating layer 521 is formed on the second auxiliary lead 500. The second auxiliary back surface plating layer 521 is laminated on a region of the second auxiliary lead 500 that is for forming the second auxiliary lead back surface 520, and is made of Ni, Sn, or an alloy thereof. In the present embodiment, the lower surface of the second auxiliary back surface plating layer 521 in the z direction is defined, for convenience, as the second auxiliary lead back surface 520, although in a configuration that does not have the second auxiliary back surface plating layer 521, for example, the second auxiliary lead back surface 520 may be constituted by the abovementioned portion made of Cu.

The second auxiliary full thickness part 530 is a region that extends from the second auxiliary lead main surface 510 to the second auxiliary lead back surface 520 in the z direction. In the present embodiment, the second auxiliary full thickness part 530 indicates a region made of Cu excluding the second auxiliary back surface plating layer 521.

The second auxiliary eave part 540 projects from a portion on the second auxiliary lead main surface 510 side of the second auxiliary full thickness part 530 in the x and y directions, which are at right angles to the z direction. An upper end face of the second auxiliary eave part 540 in the z direction is flush with the second auxiliary full thickness part 530. The second auxiliary eave part 540 constitutes the second auxiliary lead main surface 510. In the present embodiment, the second auxiliary eave part 540 has a second auxiliary front part 541, a second auxiliary lateral part 542, and a second auxiliary rear part 543. The thickness of the second auxiliary eave part 540 is half of the second auxiliary full thickness part 530, for example.

The second auxiliary front part 541 projects from the second auxiliary full thickness part 530 toward the main lead 300 in the x direction.

The second auxiliary lateral part 542 projects from the second auxiliary full thickness part 530 in the y direction. In the present embodiment, two second auxiliary lateral parts 542 are formed. The second auxiliary lateral part 542 that is located on the lower side in the y direction in FIG. 3 projects toward the first auxiliary lead 400. Also, in the present embodiment, the second auxiliary lead 500 has a second auxiliary lateral connecting part 551. The second auxiliary lateral connecting part 551 projects from the second auxiliary eave part 540. The second auxiliary lateral connecting part 551 is formed to have the same thickness as the second auxiliary lateral parts 542. The direction in which the second auxiliary lateral connecting part 551 projects is a direction that is orthogonal to a direction from the main lead 300 toward the second auxiliary lead 500. The second auxiliary lateral connecting part 551 has an end face that is exposed from the resin package 800. A distance L3 (see FIG. 3) separating the second auxiliary lateral connecting part 551 from the main lead 300 is 0.2 to 0.3 mm, for example.

The second auxiliary rear part 543 projects from the second auxiliary full thickness part 530 in the opposite direction to the second auxiliary front part 541. In the present embodiment, the second auxiliary lead 500 has a second auxiliary rear connecting part 552. The second auxiliary rear connecting part 552 extends from the second auxiliary rear part 543 of the second auxiliary eave part 540, and is formed to have the same thickness as the second auxiliary rear part 543. An end face of the second auxiliary rear connecting part 552 in the x direction is exposed from the resin package 800.

According to the abovementioned configuration, in the present embodiment, all of the second auxiliary full thickness part 530 is surrounded by the second auxiliary eave part 540 as seen in the z direction (in plan view). Also, upper surfaces of the second auxiliary full thickness part 530 and the second auxiliary eave part 540 in the z direction form the second auxiliary lead main surface 510, and the second auxiliary surface plating layer 511 overlaps with all of the second auxiliary full thickness part 530 and the second auxiliary eave part 540.

The first wire 600 is joined to the first front surface electrode 211 of the semiconductor element 200 and the first auxiliary lead main surface 410 of the first auxiliary lead 400, and has a first bonding part 610 and a second bonding part 620. The first wire 600 is made of Au of about 20 μm in diameter.

Figure 11:
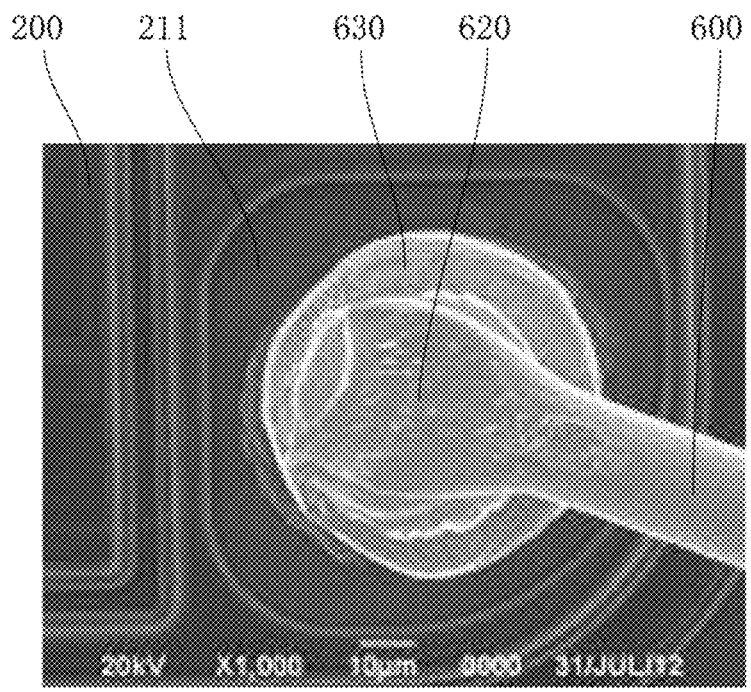
FIG. 11 is an enlarged image showing a second bonding part formed in an example of a manufacturing process of the semiconductor device of FIG. 1.

The first bonding part 610 is joined to the first auxiliary lead main surface 410 of the first auxiliary lead 400, and has a coronal lump portion. The second bonding part 620 is joined to the first front surface electrode 211 of the semiconductor element 200 via a first bump 630. The second bonding part 620 has a tapered shape whose thickness in the z direction decreases toward the tip. The first bump 630 is a region similar to the lump portion of the first bonding part 610. In the present embodiment, the first bump 630 has slightly less volume than the lump portion of the first bonding part 610. Note that the second bonding part 620 is shown in FIG. 11.

The second wire 700 is joined to the second front surface electrode 212 of the semiconductor element 200 and the second auxiliary lead main surface 510 of the second auxiliary lead 500, and has a first bonding part 710 and a second bonding part 720. The second wire 700 is made of Au of about 20 μm in diameter.

The first bonding part 710 is joined to the second auxiliary lead main surface 510 of the second auxiliary lead 500, and has a coronal lump portion. The second bonding part 720 is joined to the second front surface electrode 212 of the semiconductor element 200 via a second bump 730. The second bonding part 720 has a tapered shape whose thickness in the z direction decreases toward the tip. The second bump 730 is a region similar to the lump portion of the first bonding part 710. In the present embodiment, the second bump 730 has slightly less volume than the lump portion of the first bonding part 710.

The resin package 800 covers the semiconductor element 200, and a portion of each of the main lead 300, the first auxiliary lead 400 and the second auxiliary lead 500, and is made of a black epoxy resin, for example. Also, the resin package 800 exposes each of the back surface 320 of the main lead 300, the first auxiliary lead back surface 420 of the first auxiliary lead 400 and the second auxiliary lead back surface 520 of the second auxiliary lead 500 on the lower side in the z direction. Also, in the present embodiment, a distance from upper ends of the first wire 600 and the second wire 700 in the z direction to an upper end of the resin package 800 in the z direction is about 50 μm.

Next, the operation and effects of the present embodiment will be described. In the present embodiment, the notch 380 is formed in the main lead 300. The notch 380 has a shape that is recessed toward the center of the main lead 300 as seen in the thickness direction z of the semiconductor element 200. As a result of such a configuration, the area of the main lead main surface 310 of the main lead 300 can be reduced, thus enabling the location where the semiconductor element 200 is to be disposed on the main lead 300 to be defined. Even in the case where the semiconductor element 200 is comparatively small, the semiconductor element 200 can thereby be disposed at a desired location on the main lead 300, irrespective of the technician.

When manufacturing the semiconductor device 101, the semiconductor element 200 is die bonded to the main lead 300 at a high temperature (e.g., about 400° C.), and the semiconductor element 200 and the main lead 300 are then cooled to room temperature. The semiconductor element 200 and the main lead 300 have different coefficients of thermal expansion. Thus, when the semiconductor element 200 and the main lead 300 are cooled, the semiconductor element 200 and the main lead 300 contract at different rates. As a result, when the semiconductor element 200 and the main lead 300 are cooled, the semiconductor element 200 could possibly be damaged, due to the semiconductor element 200 being subject to excessive stress load. In particular, the main eave part 340 is easily deformed as compared with the main full thickness part 330. In the present embodiment, as described above, the semiconductor element 200 can be disposed in substantially the same position on the main lead 300 irrespective of the technician, thus enabling the semiconductor element 200 to be disposed on the main lead 300, so that as much of the semiconductor element 200 as possible overlaps with the main full thickness part 330. Damage to the semiconductor element 200 caused by the difference in thermal contraction between the semiconductor element 200 and the main lead 300 can thereby be prevented.

According to the present embodiment, the main lead main surface 310 and the semiconductor element 200 overlap with each of the main full thickness part 330 and the main eave part 340 as seen in the z direction (in plan view). The main eave part 340 exhibits a function of enhancing the joining strength between the main lead 300 and the resin package 800. The main lead 300 can be inhibited from protruding excessively from the semiconductor element 200, while achieving an improvement in this joining strength. This contributes to reducing the dimensions of the semiconductor device 101 as seen in the z direction (in plan view).

As a result of the main eave part 340 having the main front part 341, the joining strength between the main lead 300 and the resin package 800 can be enhanced. Also, the main lead back surface 320 excessively approaching the first auxiliary lead back surface 420 and the second auxiliary lead back surface 520 can be avoided, while bringing the semiconductor element 200 closer to the first auxiliary lead 400 and the second auxiliary lead 500.

As a result of the main eave part 340 having the main lateral parts 342 and the main rear part 343, the joining strength between the main lead 300 and the resin package 800 can be enhanced. A configuration in which all of the main full thickness part 330 is surrounded by the main eave part 340 is favorable for enhancing the joining strength between the main lead 300 and the resin package 800.

The first main lateral connecting parts 351A, the second main lateral connecting parts 351B and the main rear connecting parts 352 appropriately hold the main lead 300 in the manufacturing process of the semiconductor device 101. The end faces of the first main lateral connecting parts 351A, the second main lateral connecting parts 351B and the main rear connecting parts 352 are separated from the main lead back surface 320 that is exposed from the resin package 800. There is thus little possibility of solder for surface mounting of the semiconductor device 101 accidentally spreading to the end faces of the first main lateral connecting parts 351A, the second main lateral connecting parts 351B, and the main rear connecting parts 352.

As a result of the main front surface plating layer 311 being formed on the main lead main surface 310, the joining strength between the back surface electrode 220 of the semiconductor element 200 and the main lead main surface 310 can be enhanced. As a result of the main front surface plating layer 311 overlapping with all of the main eave part 340, the area that can be utilized as the main lead main surface 310 can be enlarged.

As a result of the first auxiliary lead 400 having the first auxiliary eave part 440, the joining strength between the first auxiliary lead 400 and the resin package 800 can be enhanced. As a result of the first auxiliary eave part 440 having the first auxiliary front part 441, the first auxiliary lead back surface 420 excessively approaching the main lead back surface 320 can be avoided while enhancing the joining strength with the resin package 800.

As a result of the first auxiliary eave part 440 having the first auxiliary lateral parts 442 and the first auxiliary rear part 443, the joining strength between the first auxiliary lead 400 and the resin package 800 can be enhanced. A configuration in which all of the first auxiliary full thickness part 430 is surrounded by the first auxiliary eave part 440 is favorable for enhancing the joining strength between the first auxiliary lead 400 and the resin package 800. As a result of the first auxiliary lateral part 442 on the second auxiliary lead 500 side being relatively large, the first auxiliary lead back surface 420 excessively approaching the second auxiliary lead back surface 520 can be avoided, together with achieving an improvement in joining strength.

The first auxiliary lateral connecting part 451 and the first auxiliary rear connecting part 452 appropriately hold the first auxiliary lead 400 in the manufacturing process of the semiconductor device 101. An end face of the first auxiliary lateral connecting part 451 in the y direction and an end face of the first auxiliary rear connecting part 452 in the x direction are separated from the first auxiliary lead back surface 420 that is exposed from the resin package 800. There is thus little possibility of solder for surface mounting the semiconductor device 101 accidentally spreading to the end face of the first auxiliary lateral connecting part 451 in the y direction and the end face of the first auxiliary rear connecting part 452 in the x direction.

As a result of the first auxiliary front surface plating layer 411 being formed on the first auxiliary lead main surface 410, the joining strength between the first wire 600 and the first auxiliary lead main surface 410 can be enhanced.

As a result of the second auxiliary lead 500 having the second auxiliary eave part 540, the joining strength between the second auxiliary lead 500 and the resin package 800 can be enhanced. As a result of the second auxiliary eave part 540 having the second auxiliary front part 541, the second auxiliary lead back surface 520 excessively approaching the main lead back surface 320 can be avoided, while enhancing the joining strength with the resin package 800.

As a result of the second auxiliary eave part 540 having the second auxiliary lateral parts 542 and the second auxiliary rear part 543, the joining strength between the second auxiliary lead 500 and the resin package 800 can be enhanced. A configuration in which all of the second auxiliary full thickness part 530 is surrounded by the second auxiliary eave part 540 is favorable for enhancing the joining strength between the second auxiliary lead 500 and the resin package 800. As a result of the second auxiliary lateral part 542 on the first auxiliary lead 400 side being relatively large, the second auxiliary lead back surface 520 excessively approaching the first auxiliary lead back surface 420 can be avoided, together with achieving an improvement in joining strength.

The second auxiliary lateral connecting part 551 and the second auxiliary rear connecting part 552 appropriately hold the second auxiliary lead 500 in the manufacturing process of the semiconductor device 101. An end face of the second auxiliary lateral connecting part 551 in the y direction and an end face of the second auxiliary rear connecting part 552 in the x direction are separated from the second auxiliary lead back surface 520 that is exposed from the resin package 800. There is thus little possibility of solder for surface mounting the semiconductor device 101 accidentally spreading to the end face of the second auxiliary lateral connecting part 551 in the y direction and the end face of the second auxiliary rear connecting part 552 in the x direction.

As a result of the second auxiliary surface plating layer 511 being formed on the second auxiliary lead main surface 510, the joining strength between the second wire 700 and the second auxiliary lead main surface 510 can be enhanced.

With the join between the semiconductor element 200 and the main lead main surface 310 of the main lead 300, the back surface electrode 220 consisting of a monolithic metal layer is joined directly to the main lead main surface 310, and vibration is not applied at the time of joining. As a result of such a configuration, a margin that allows for vibration does not need to be set in the region of the main lead 300 that is located around the semiconductor element 200. This is advantageous for miniaturization of the semiconductor device 101.

Note that, in practice, when the main lead 300, the first auxiliary lead 400 and the second auxiliary lead 500 are patterned by etching, the boundary between the main full thickness part 330 and the main eave part 340 could be a curved surface, rather than the definite angle showed in FIGS. 1 to 9 and the like being formed. Similarly, other boundaries such as between the first auxiliary full thickness part 430 and the first auxiliary eave part 440 of the first auxiliary lead 400 could be curved surfaces. This is because even if a design intended to obtain the form shown in FIGS. 1 to 9 and the like is achieved, the curved surfaces described above may unavoidably occur in the etching process, in the case where the semiconductor device 101 has the extremely compact configuration described above.

Figure 12:
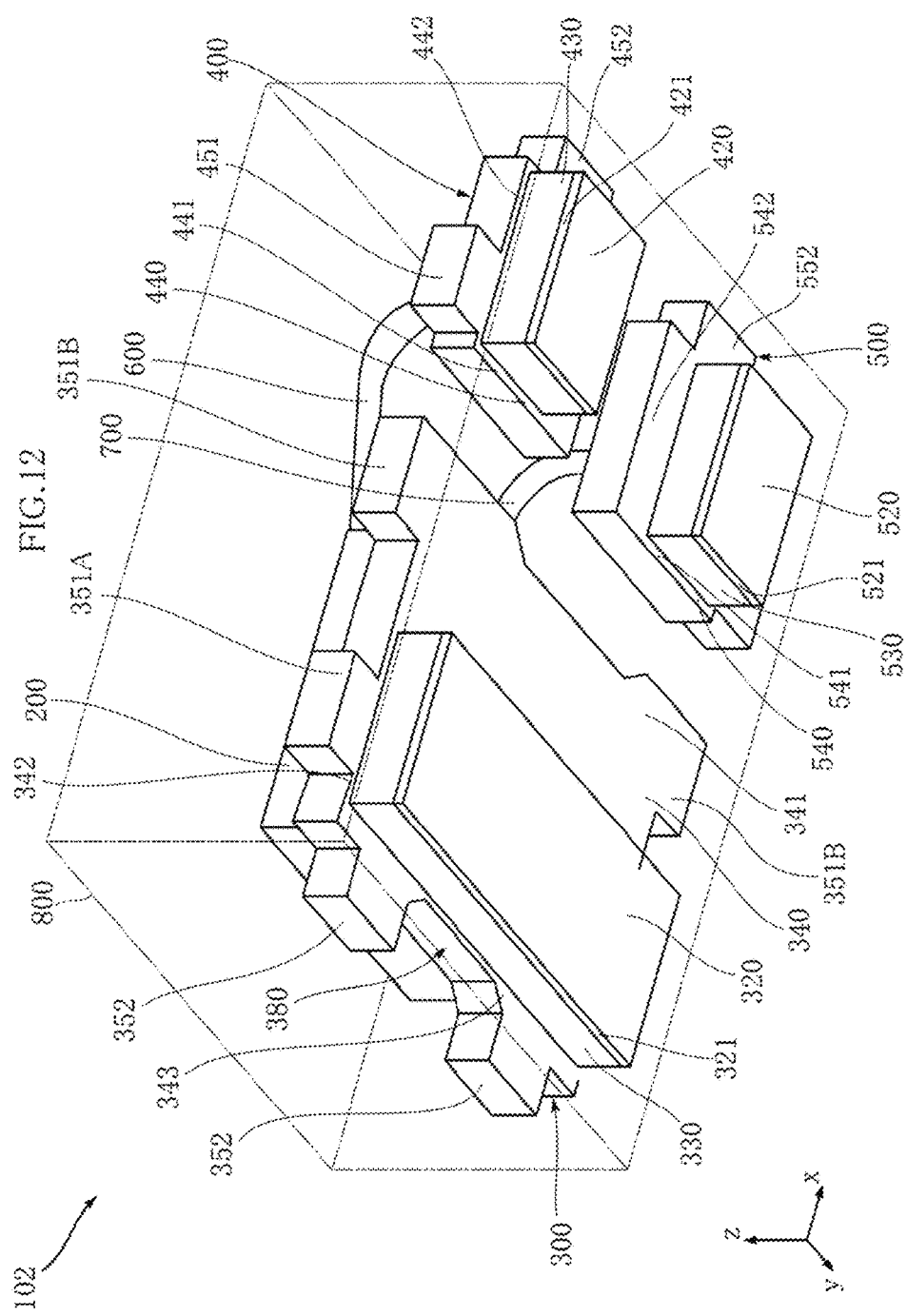
FIG. 12 is a perspective view showing an example of a semiconductor device that is based on a second embodiment of the present invention.

FIGS. 12 and 13 show an example of a semiconductor device that is based on a second embodiment of the present invention. A semiconductor device 102 of the present embodiment differs from the abovementioned embodiment in that the notch 380 is provided in a different location.

FIG. 12 is a perspective view showing the semiconductor device 102. FIG. 13 is a plan view showing the semiconductor device 102.

In the present embodiment, the notch 380 has a shape that is recessed from a region of the main lead 300 on the opposite side to the first auxiliary lead 400, as seen in the z direction (in plan view). Also, the main lead 300 has an end face 391 that is located on the opposite side to the first auxiliary lead 400. The notch 380 has a shape that is recessed from the end face 391 as seen in the z direction (in plan view). The notch 380 similarly has a shape in which the main front surface plating layer 311 is recessed in the present embodiment. Note that the main rear connecting parts 352 project rearward from an end face 391.

Such an embodiment similarly enables the semiconductor element 200 to be disposed at a desired location on the main lead 300, irrespective of the technician, even in the case where the semiconductor element 200 is comparatively small.

The present invention is not limited to the abovementioned embodiments. Various design modifications can be made to the specific configurations of the respective parts of the present invention.

The invention claimed is:

1. A semiconductor device comprising:
a semiconductor element;
a main lead on which the semiconductor element is disposed;
a first auxiliary lead and a second auxiliary lead, the first auxiliary lead and the second auxiliary lead each being electrically connected to the semiconductor element;
a first wire electrically connecting the semiconductor element to the first auxiliary lead;
a second wire electrically connecting the semiconductor element to the second auxiliary lead; and
a resin package covering the semiconductor element, the main lead, the first auxiliary lead, and the second auxiliary lead,
wherein the main lead includes a main full thickness part and a main eave part that is smaller in size in a thickness direction of the semiconductor element than the main full thickness part,
the semiconductor element overlaps with each of the main full thickness part and the main eave part in plan view,
the main eave part includes an end face that faces the first auxiliary lead and the second auxiliary lead and that is formed with a notch recessed toward a center of the main lead in plan view,
the first auxiliary lead includes a first auxiliary full thickness part and a first auxiliary eave part that is smaller in size in the thickness direction of the semiconductor element than the first auxiliary full thickness part,
the second auxiliary lead includes a second auxiliary full thickness part and a second auxiliary eave part that is smaller in size in the thickness direction of the semiconductor element than the second auxiliary full thickness part,
the first wire is bonded at a position overlapping with the first auxiliary full thickness part in plan view, and the second wire is bonded at a position overlapping with the second auxiliary full thickness part in plan view,
the first wire has an end bonded to the semiconductor element, the end of the first wire being bonded to the semiconductor element at a position that overlaps with the main full thickness part in plan view,
the main eave part is formed with a pair of main lateral connecting parts that project in mutually opposite directions from a main body of the main eave part, the main lateral connecting parts including respective front faces and respective back faces opposite to the respective front faces, the front faces being flush with the end face of the main eave part, and
the second wire has an end bonded to the semiconductor element, the end of the second wire being bonded to the semiconductor element at a position that overlaps with the main eave part in plan view and is located between the main full thickness part and an imaginary straight line connecting the back faces of the main lateral connecting parts in plan view.

2. The semiconductor device according to claim 1, wherein the first auxiliary lead is separated from the main lead and exposed from the resin package.

3. The semiconductor device according to claim 1, wherein the notch has a shape recessed in a direction from the first auxiliary lead toward the main lead in plan view.

4. The semiconductor device according to claim 1, wherein the main lead has a main lead main surface and a main lead back surface that face in opposite directions to each other, and
the semiconductor element is disposed on the main lead main surface.

5. The semiconductor device according to claim 4, wherein the main full thickness part extends from the main lead main surface to the main lead back surface, and
the main eave part projects from the main full thickness part in a direction at right angles to the thickness direction of the semiconductor element.

6. The semiconductor device according to claim 1, wherein the semiconductor element overlaps with the main lead in plan view, throughout an entirety of the semiconductor element.

7. The semiconductor device according to claim 1, wherein the main body of the main eave part has a main front part,
the main front part projects from the main full thickness part toward the first auxiliary lead, and
the notch is formed in the main front part.

8. The semiconductor device according to claim 7, wherein the main body of the main eave part has a main lateral part, and the main lateral part projects from the main full thickness part in a direction at right angles to the direction in which the main front part projects.

9. The semiconductor device according to claim 7, wherein the main body of the main eave part has a main rear part, and the main rear part projects from the main full thickness part in an opposite direction to the direction in which the main front part projects.

10. The semiconductor device according to claim 9, wherein the main lead includes a main rear connecting part projecting from the main rear part, and the main rear connecting part has an end face exposed from the resin package.

11. The semiconductor device according to claim 1,
the mutually opposite directions in which the main lateral connecting parts project are each a direction orthogonal to a direction from the main lead toward the first auxiliary lead, and
the each of the lateral connecting parts has an end face exposed from the resin package.

12. The semiconductor device according to claim 11, wherein the main lead includes a pair of additional main lateral connecting parts projecting from the main body of the main eave part,
the additional main lateral connecting parts each project in a direction orthogonal to a direction from the main lead toward the first auxiliary lead,
each of the additional main lateral connecting parts has an end face exposed from the resin package, and
the pair of additional main lateral connecting parts disposed farther from the end face of the main eave part than the pair of main lateral connecting parts.

13. The semiconductor device according to claim 12, wherein a distance separating the pair of main lateral connecting parts from the pair of additional main lateral connecting parts is 0.2 to 0.3 mm.

14. The semiconductor device according to claim 1, wherein the main full thickness part is surrounded by the main eave part in plan view, throughout an entirety thereof.

15. The semiconductor device according to claim 1, further comprising:
a main front surface plating layer formed on the main lead, and interposed between the semiconductor element and the main lead.

16. The semiconductor device according to claim 15, wherein the main front surface plating layer has a substantially rectangular shape in plan view.

17. The semiconductor device according to claim 15, wherein the notch has a shape in which the main front surface plating layer is recessed in plan view.

18. The semiconductor device according to claim 15, wherein the main front surface plating layer overlaps with an entirety of the main eave part.

19. The semiconductor device according to claim 1, wherein the first auxiliary lead has a first auxiliary lead main surface and a first auxiliary lead back surface that face in opposite directions to each other,
the first auxiliary full thickness part extends from the first auxiliary lead main surface to the first auxiliary lead back surface, and
the first auxiliary eave part projects from the first auxiliary full thickness part in a direction at right angles to the thickness direction of the semiconductor element, and constitutes the first auxiliary lead main surface.

20. The semiconductor device according to claim 19, wherein the first auxiliary eave part has a first auxiliary front part, and
the first auxiliary front part projects from the first auxiliary full thickness part toward the main lead.

21. The semiconductor device according to claim 19, wherein the first auxiliary lead includes a first auxiliary lateral connecting part projecting from the first auxiliary eave part,
the direction in which the first auxiliary lateral connecting part projects is a direction orthogonal to a direction from the main lead toward the first auxiliary lead, and
the first auxiliary lateral connecting part has an end face exposed from the resin package.

22. The semiconductor device according to claim 21, wherein a distance separating the first auxiliary lateral connecting part from the main lead is 0.2 to 0.3 mm.

23. The semiconductor device according to claim 19, wherein the main eave part has an obverse surface disposed at a same level of height as the first auxiliary lead main surface.

24. The semiconductor device according to claim 1, further comprising:
a first auxiliary surface plating layer interposed between the first auxiliary lead and the first wire.

25. The semiconductor device according to claim 1, wherein the second auxiliary lead is separated from the main lead and exposed from the resin package.

26. The semiconductor device according to claim 1, further comprising:
a second auxiliary surface plating layer interposed between the second auxiliary lead and the second wire.

27. The semiconductor device according to claim 1, wherein the semiconductor element has a semiconductor layer, a eutectic layer of a semiconductor and a metal, and a monolithic metal layer constituting a back surface electrode that are laminated one on the other, and the monolithic metal layer is joined directly to the main lead.

28. The semiconductor device according to claim 27, wherein the eutectic layer is made of a eutectic of Si and Au.

29. The semiconductor device according to claim 27, wherein the monolithic metal layer is thinner than the eutectic layer.

30. The semiconductor device according to claim 1, wherein the main full thickness part and the main eave part have obverse surfaces, respectively, that face the semiconductor element and form a flush surface.

31. The semiconductor device according to claim 1, wherein the notch includes a linear edge that extends along an edge of the semiconductor element in plan view, and each of the first wire and the second wire traverses the linear edge of the notch in plan view.

32. The semiconductor device according to claim 1, wherein
the semiconductor element includes a first electrode and a second electrode, the end of the first wire being bonded to the first electrode, and the end of the second wire being bonded to the second electrode,
the second electrode includes a first end and a second end, the first end and second end being spaced apart from each other along a direction that separates the first auxiliary lead and the main lead in plan view,
the first end of the second electrode is located between the notch of the main eave part and the second end of the second electrode in plan view, and
the second end of the second electrode is located at a substantially same location as a boundary between the main full thickness part and the main eave part in plan view.

33. The semiconductor device according to claim 1, wherein each of the first wire and the second wire traverses the notch in plan view.

34. The semiconductor device according to claim 1, wherein
the notch includes two opening ends that are spaced apart from each other in a direction that is perpendicular to both the thickness direction and a direction from the main lead towards the first auxiliary lead, and
a distance of the two opening ends of the notch is greater than half of a dimension of the main eave part in the direction that is perpendicular to both the thickness direction and the direction from the main lead towards the first auxiliary lead.

\* \* \* \* \*